United States Patent [19]

Hashimoto

[11] Patent Number: 4,893,281

[45] Date of Patent: Jan. 9, 1990

[54] SEMICONDUCTOR MEMORY SYSTEM WITH PROGRAMMABLE ADDRESS DECODER

[75] Inventor: Masashi Hashimoto, Inashiki, Japan

[73] Assignee: Texas Instruments Incorporated, Dallas, Tex.

[21] Appl. No.: 911,926

[22] Filed: Sep. 25, 1986

[30] Foreign Application Priority Data

Oct. 8, 1985 [JP] Japan .................. 60-225738

[51] Int. Cl.⁴ .................. G11C 7/00; G11C 8/00
[52] U.S. Cl. .................. 365/230.06; 365/189.05; 365/233.5
[58] Field of Search .................. 365/230, 189, 96, 233, 365/233.5, 230.06, 189.05

[56] References Cited

U.S. PATENT DOCUMENTS 4,441,167 4/1984 Principi .................. 365/96 X
4,633,429 12/1986 Lewandowsk et al. .................. 365/230 X Primary Examiner—Stuart N. Hecker
Assistant Examiner—Alyssa H. Bowler
Attorney, Agent, or Firm—William E. Hiller; N. Rhys Merrett; Melvin Sharp

[57] ABSTRACT

A semiconductor memory system using address signals each consisting of a first predetermined number of logic bits, comprising a memory array having a number of memory cells and access lines along which the memory cells are arranged in rows or columns, and a programmable address decoder responsive to a second number of logic bits of each of the address signals, the second predetermined number being not larger than the first predetermined number. The address decoder comprises a plurality of address generation networks commonly connected to the address bus and respectively associated with the access lines and is operative to generate a predetermined sequence of address bits representing a desired address for one of the access lines in the memory array in response to the second predetermined number of address bits of each of the address signals. Each of the address generation networks comprises a plurality of programmable memory cells and a switching circuit for selecting memory cells out of all the programmable memory cells of each of the address generation networks in response to the predetermined sequence of the address bits generated in the address decoder.

12 Claims, 3 Drawing Sheets

4,893,281

SEMICONDUCTOR MEMORY SYSTEM WITH PROGRAMMABLE ADDRESS DECODER

FIELD OF THE INVENTION

The present invention relates to semiconductor memory systems and particularly to a semiconductor memory system for use with main memory system using a masked read-only memory device.

BACKGROUND OF THE INVENTION

A masked read-only memory device (hereinafter referred to as mask ROM device) is a information storage device into which information has been written with use of a particular photomask during fabrication of the memory device. Once information is thus written into the mask ROM device, the information is retained throughout use of the memory device. Such a memory device is useful especially for fixedly storing any program typically in a microcomputer system.

Such a semiconductor memory device has a drawback in that the addresses of the individual memory cells of the device have already been fixedly determined so that the address space for the memory device could not be modified arbitrarily. It is thus impossible to revise the information which has been written into a mask ROM device (as by re-numbering the address pages). It is further pointed out that, for a mask ROM device used for the storage of Japanese letters and characters, approximately two thirds of the total address space available for the memory device is left unused.

It is, accordingly, an important object of the present invention to provide a semiconductor memory system which is capable of arbitrarily revising the information which has been written into a main memory system using a mask ROM device.

It is another important object of the present invention to provide a semiconductor memory system in which the addresses for the memory array of the system are readily programmable independently of those which have been fixed for the memory array of a main memory system.

It is still another important object of the present invention to provide a semiconductor memory system which will make it possible to utilize the unused portion of the address space available for the storage of information in a main memory system.

SUMMARY OF THE INVENTION

In accordance with the present invention, there is provided a semiconductor memory system in combination with means for supplying a succession of address signals each consisting of a first predetermined number of logic bits, comprising (a) a memory array having a number of memory cells arranged in rows and columns and access lines along which the memory cells are arranged in rows or columns, (b) an address bus responsive to a second number of logic bits of each of the address signals, the second predetermined number being not larger than the first predetermined number, (c) a programmable address decoder comprising a plurality of address generation networks commonly connected to the address bus and respectively associated with the access lines, the address decoder being operative to generate a predetermined sequence of address bits representing a desired address for one of the access lines in response to the second predetermined number of address bits of each of the address signals, each of the address generation networks having a plurality of programmable memory cells, and d) switching means for selecting memory cells out of all the programmable memory cells of each of the address generation networks in response to the predetermined sequence of the address bits generated in the address decoder.

BRIEF DESCRIPTION OF THE DRAWINGS

The features and advantages of a memory system according to the present invention will be more clearly appreciated from the following description taken in conjunction with the accompanying drawings in which.

DESCRIPTION OF THE PREFERRED EMBODIMENTS

Figure 1:
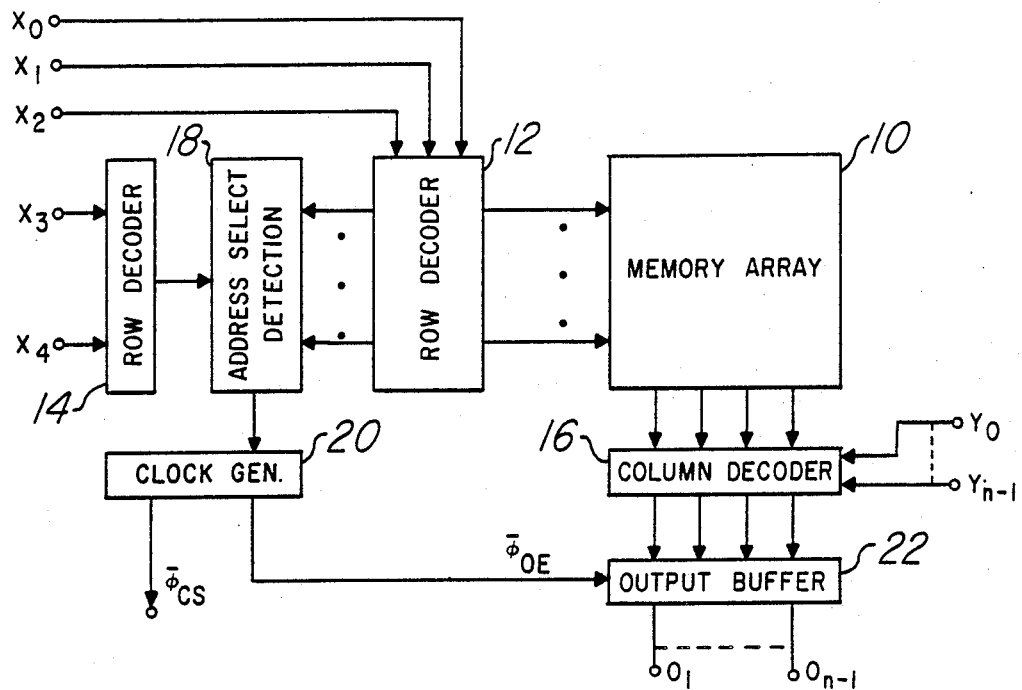
FIG. 1 is a block diagram showing the general construction and arrangement of a preferred embodiment of a semiconductor memory system according to the present invention.

Referring to FIG. 1, a semiconductor memory system embodying the present invention comprises a memory array 10 which is composed of a number of programmable memory cells arranged in rows and columns. As will be understood as the description proceeds, the memory array 10 is provided additionally to the mask ROM device of a main memory system (not shown) for the purpose of storing information therein independently of the information fixedly stored in the main memory system. In association with the programmable memory array 10 are provided first and second row address decoders 12 and 14 and a single column address decoder 16. The first row address decoder 12 has a plurality of output terminals respectively connected to the individual word lines (not shown) of the memory array 10. The column address decoder 16 has a plurality of address input terminals for receiving row addresses $Y_0$ to $Y_{n-1}$, respectively, and a plurality of data input terminals respectively connected to the individual bit lines (not shown) of the memory array 10.

An address signal used in the memory system embodying the present invention is assumed for purposes of description as consisting of five bits $X_0$, $X_1$, $X_2$, $X_3$ and $X_4$. Of these five address bits of the supplied address signal, the lower three bits $X_0$, $X_1$ and $X_2$ are input to the first row address decoder 12 and the remaining two bits $X_3$ and $X_4$ input to the second row address decoder 14. A particular combination or sequence of logic "1" and "0" bits formulated to provide the desired address of a word line of the memory array 10 is generated in the row address decoder 12 in response to the lower three bits $X_0$, $X_1$ and $X_2$ of each input row address signal. The addresses for the individual word lines of the memory array 10 can thus be arbitrarily programmed exclusively for each of the input row address signals and independently of the addresses for the mask ROM device of the main memory system. A logic "1" signal appears at any of the output terminals of the address decoder 12 during each read cycle of operation of the memory system depending upon the addresses programmed in the first row address decoder 12. The remaining two bits $X_3$ and $X_4$ of each input row address signal are supplied to the second row address decoder 14, in which a single fixed combination of logic "1" and "0" bits is generated in response to the bits $X_3$ and $X_4$. A signal of either logic "1" level or logic "0" level is in this manner output from the second row address decoder 14 during each read cycle of operation of the system depending upon the combination of the logic "1" and "0" bits generated in response to the two bits $X_3$ and $X_4$ of the supplied row address signal. It will thus be seen that, while the address bits to be generated in the first row address decoder 12 are totally programmable, the address bits to be generated in the second row address decoder 14 are substantially fixed although the particular bits can be selected arbitrarily. For simplicity of description, the column address decoder 16 is herein assumed to have no address programming capabilities.

During each read cycle of operation of the system, a logic "1" signal thus appears at one of the output terminals of the first row address decoder 12 with a logic "0" signal appearing at each of the remaining output terminals of the address decoder 12. These output signals including a single logic "1" signal are supplied on one hand to the memory array 10 and the other hand to a row address select detection circuit 18. This address select detection circuit 18 also receives the logic "1" or "0" output signal from the second row address decoder 14 during each read cycle of the system. The address select detection circuit 18 is constructed and arranged to to produce an output signal of a predetermined logic level in the copresence of the logic "1" output signal from the second row address decoder 14 and the sole logic "1" signal included in the output signals from the first row address decoder 12.

The memory system embodying the present invention further comprises a clock generator circuit 20 having an input terminal connected to the address select detection circuit 18 and responsive to the logic "1" output signal from the circuit 18. The clock generator circuit 20 further has first and second output terminals and is operative to produce a clock signal $\phi_{OE}$ of a logic "1" level at its first output terminal and a clock signal $\phi_{CS}$ of a logic "0" level at its second output terminal in response to the logic "1" output signal from the address select detection circuit 18. In the absence of a logic "1" signal at the input terminal of the clock generator circuit 20, the clock signal $\phi_{OE}$ at the first output terminal of the circuit 20 assumes a logic "0" level and the clock signal $\phi_{CS}$ at the second output terminal of the circuit 20 assumes a logic "1" level. The clock signal $\phi_{OE}$ that appears at the first output terminal of the clock generator circuit 20 is an output enable signal and assumes the logic "1" level when the row address passed to the memory array 10 consists of a programmed sequence of logic "1" and "0" bits. Such an output enable signal $\phi_{OE}$ is supplied to a data output buffer 22 which is responsive to the data output from the memory array 10 through the column address decoder 16. When maintained in a logic "1" level, the output enable signal $\phi_{OE}$ thus enables the output buffer 22 to deliver output signals therefrom and, when swung to a logic "0" level, holds the buffer 22 in a high impedance state. Thus, output signals are supplied from the data output buffer 22 when, and only when, the row address transferred to the memory array 10 consists of a programmed sequence of logic "1" and "0" bits. On the other hand, the clock signal $\phi_{CS}$ appearing at the second output terminal of the clock generator circuit 20 is used as an output disable signal for disabling a device on another semiconductor chip provided in association with the memory array 10, as will be described in more detail.

Figure 2:
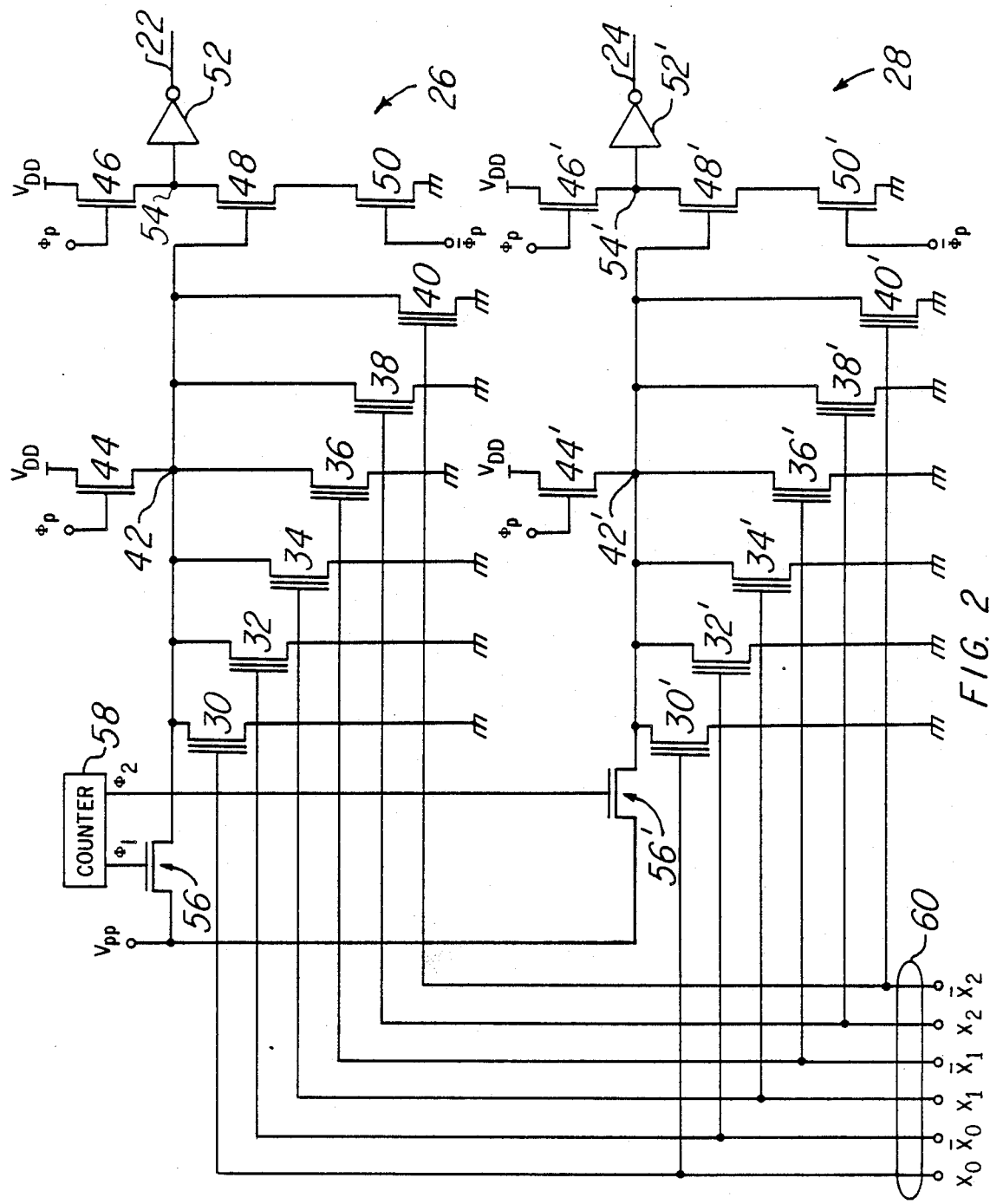
FIG. 2 is a circuit diagram showing part of the circuit arrangement of a programmable row address decoder which forms part of the memory system illustrated in FIG. 1.

FIG. 2 shows the circuit arrangement of part of the first programmable row address decoder 12 to which the first, second and third bits $X_0$, $X_1$ and $X_2$ of a row address signal are to be supplied from an external source such as typically a microprocessor (not shown). The circuit arrangement herein shown is associated with two of the word lines included in the programmable memory array 10 shown in FIG. 1, the two word lines being herein shown consisting of first and second word lines 22 and 24.

The first row address decoder 12 is comprised of memory cells each consisting of an electrically erasable and programmable read-only memory (EEPROM) using an n-channel metal-oxide semiconductor (MOS) field effect transistor. The use of such memory cells is however merely by way of example and it will be apparent that other types of memory cells may also be used in a programmable address decoder of a memory system according to the present invention. It may be herein noted that the programmable memory array 10 shown in FIG. 1 is also assumed to be made up of EEPROMS using MOS field-effect transistors.

In FIG. 2, the programmable row address decoder 12 is shown comprising first and second address generation networks 26 and 28 which are respectively associated with the first and second word lines 22 and 24 of the programmable memory array 10 in the arrangement of FIG. 1. The two address generation networks 26 and 28 are constructed and arranged similarly to each other and, for this reason, the component elements which are common between the two networks are designated by like reference numerals with a prime affixed to each of the numerals used for the latter. In response to the first, second and third bits $X_0$, $X_1$ and $X_2$ of an address signal applied to the address decoder 12, there are produced three pairs of complementary address bits $x_0$ and $\bar{x}_0$, $x_1$ and $\bar{x}_1$, and $x_2$ and $\bar{x}_2$, respectively.

The first address generation network 26 comprises first to sixth memory cells 30, 32, 34, 36, 38 and 40 each of which has a source, a drain, a floating gate and a control gate. These memory cells 30 to 40 have their respective sources connected to ground line and their respective drains connected to a common node 42. The control gates of the memory cells 30, 32, 34, 36, 38 and 40 are connected to common address lines to which are to be applied the address bits $x_0$, $\bar{x}_0$, $x_1$, $\bar{x}_1$, $x_2$ and $\bar{x}_2$, respectively, produced from the input bits $X_0$, $X_1$ and $X_2$. Under initial conditions in which the address decoder 12 has not yet been programmed, the MOS field-effect transistor forming each of the memory cells 30 to 40 has a sufficiently low threshold voltage enabling the transistor to act as an ordinary enhancement type device.

To the common node 42 in the network 26 is connected the source of a first control transistor 44 which has its drain connected to a source of a supply voltage $V_{DD}$ and its gate connected to a source of a precharge signal $\phi_P$. There is further provided a series combination of second, third and fourth control transistors 46, 48 and 50. The second control transistor 46 has its drain connected to the source of the supply voltage $V_{DD}$ and its gate connected to the source of the precharge signal $\phi_P$. The third control transistor 48 has its drain connected to the source of the second control transistor 46 and its gate connected to the common node 42. The fourth control transistor 50 has its drain connected to the source of the third control transistor 48, its source connected to ground line and its gate connected to a source of a discharge signal $\bar{\phi}_P$ which is complementary in logic value to the precharge signal $\phi_P$. Further provided in the address generation network 26 is a buffer inverter 52 which has its input terminal connected to an output node 54 between the second and third control transistors 46 and 48 and its output terminal connected to the first word line 22. In the second address generation network 28, the buffer inverter 52' has its output terminal connected to the second word line 24.

The common node 42 of the address generation network 26 is further connected to a source of a programming voltage $V_{PP}$ through the source and drain of a gating transistor 56 which has its gate connected to a counter 58 which is adapted to produce activating signals $\phi_1, \phi_2, \ldots$ which are to sequentially shift to high levels. It may be herein noted that the activating signals $\phi_1, \phi_2, \ldots$ to be produced by the counter 58 are logically exclusive so that only one of these signals is permitted to remain at high level during address programming operation for each of the address generation networks. The counter 58 to produce such signals can be implemented readily by a known forward counter and, for this reason, no detailed construction thereof is herein shown. Of the activating signals $\phi_1, \phi_2, \ldots$ supplied from the counter 58, the signal $\phi_1$ is applied to the gate of the gating transistor 56 of the first address generation network 26 and the signal $\phi_2$ applied to the gate of the gating transistor 56' of the second address generation network 28. Each of the first to fourth control transistors and the gating transistor of each of the address generation networks is assumed to be constituted by an n-channel MOS field-effect transistor. The programming voltage $V_{PP}$ is herein assumed to be significantly higher than the supply voltage $V_{DD}$ as will be seen from FIG. 3.

Figure 3:
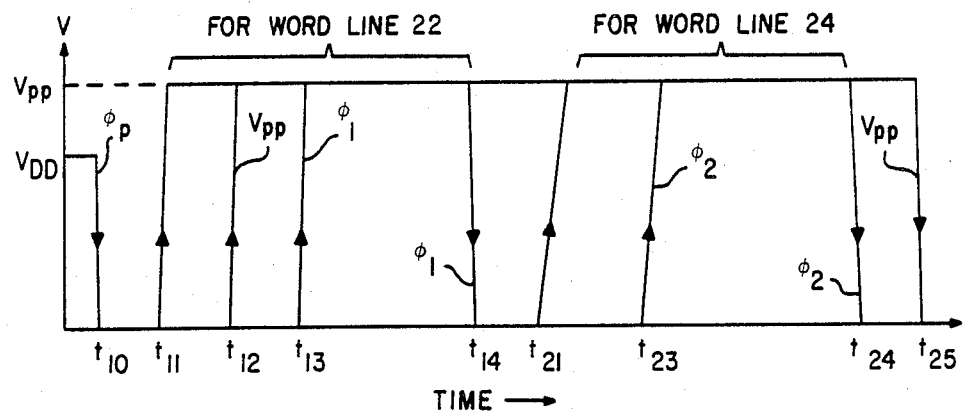
FIG. 3 a timechart showing the events which are to take place during address programming operation in the memory system embodying present invention.

During precharge mode of operation, only the precharge signal $\phi_P$ is swung to a high level (which approximates the supply voltage $V_{DD}$) as indicated in FIG. 3 with the signal $\phi_1$ and the discharge signal $\bar{\phi}_P$ maintained at low levels. The precharge signal $\phi_P$ of high level appearing at the gate of the first control transistor 44 activates the transistor 44 to turn on so that the common node 42 is precharged to a level approximating the supply voltage $V_{DD}$. With a voltage of such a level built up at the common node 42, the third control transistor 48 is activated to turn on but remains disconnected from ground line by the fourth control transistor 50 which remains in non-conduction state with the discharge signal $\bar{\phi}_P$ of a low level established at the gate of the transistor 50. In the presence of the precharge signal $\phi_P$ of high level at the gate of the second control transistor 46, the transistor 46 is also activated to turn on so that the output node 54 between the second and third control transistors 46 and 48 is also precharged to a level approximating the supply voltage $V_{DD}$. It therefore follows that a logic "0" state is established on the first word line 22 through the buffer inverter 52. Similar events take place in the second address generation network 28 so that there also is a logic "0" state established on the second word line 24. It is to be noted that the address bits $x_0$, $\bar{x}_0$, $x_1$, $\bar{x}_1$, $x_2$ and $\bar{x}_2$ which appear at the control gates of the memory cells 30 to 40 are all maintained at logic "0" levels when the address generation networks are in a precharge mode of operation. It may also be noted that, when the address generation networks 26 and 28 have been "cleared" and are held in non-programmed conditions, each of the associated word lines 22 and 24 is maintained in a logic "0" state regardless of any combination of the logic states of the bits $X_0$, $X_1$ and $X_2$ of the supplied row address signal.

The precharge mode of operation terminates with the swing of the precharge signal $\phi_P$ to a low level as at time $t_{10}$ as shown in FIG. 3. At time $t_{11}$ thereafter, one of the address bits $x_0$ and $\bar{x}_0$ shifts to a logic "1" level and the other shifts to a logic "0" level in response to the first input bit $X_0$. Likewise, one of the address bits $x_1$ and $\bar{x}_1$ *shifts to a logic* "1" level and the other to a logic "0" level in response to the second input bit $X_1$ and one of the address bits $x_2$ and $\bar{x}_2$ shifts to a logic "1" level and the other to a logic "038 level in response to the third input bit $X_2$. The result is that three of the six memory cells 30 to 40 thus receive logic "1" address bits at their respective control gates. The transistor forming each of the memory cells 30 to 40 having a low threshold voltage as previously noted, the transistors forming these three memory cells are activated to turn on to provide conductive paths from the common node 42 to ground line therethrough. The potential at the node 42 which has been precharged to a level approximating the supply voltage $V_{DD}$ is now reduced to ground level and causes the third control transistor 48 to turn off. The output node 54 is therefore maintained disconnected from ground line by mean of this third control transistor 48 although the fourth control transistor 50 will then be activated to turn on by the discharge signal $\bar{\phi}_P$ shifting to a high level. Similar events take place in the second address generation network 28 so that logic "0" states are maintained on the first and second word lines 22 and 24.

Description will now be made regarding the address programming mode of operation in which the addresses for the first and second word lines 22 and 24 of the memory array 10 are to be programmed in response to the bits $X_0$, $X_1$ and $X_2$ of an input row address signal.

With the transition of the precharge signal $\phi_P$ from logic "1" level to logic "0" level at time $t_{10}$ (FIG. 3), the precharge mode of operation is terminated as previously noted. Address bits $x_0$, $\bar{x}_0$, $x_1$, $\bar{x}_1$, $x_2$ and $\bar{x}_2$ provide the lower three bits of a desired address for the first word line 22 and are then produced in response to the bits $X_0$, $X_1$ and $X_2$ of the input row address signal. By way of example, it is herein assumed that the lower three bits of the desired address for the word line 22 are in the forms of (0, 0, 0) so that each of the address bits $x_0$, $x_1$ and $x_2$ assumes a logic "0" value and each of the address bits $\bar{x}_0$, $\bar{x}_1$ and $\bar{x}_2$ assumes a logic "1" value. These address bits $x_0$, $\bar{x}_0$, $x_1$, $\bar{x}_1$, $x_2$ and $\bar{x}_2$ appear on common address bus lines 60 of the address decoder and are transferred through the bus lines 60 to the control gates of the EEPROM cells 30, 32, 34, 36, 38 and 40, respectively, as at time $t_{11}$ (FIG. 3). With the logic "0" address bits $x_0$, $x_1$ and $x_2$ appearing at their respective gates, the field-effect transistors forming the first, third and fifth memory cells 30, 34 and 38 remain in non-conduction states. On the other hand, the transistors forming the second, fourth and sixth memory cells 32, 36 and 40 are activated to turn on so that the potential at the node 42 which has been precharged to a high level is reduced to ground level. Subsequently, the programming voltage $V_{PP}$ is produced as at time $t_{12}$ whereupon the activating signal $\phi_1$ appearing at the gate of the gating transistor 56 shifts to high level state as at time $t_{13}$, thereby selecting the first address generation network 26 out of all the address generation networks. It may be noted that the activating signal $\phi_2$ appearing at the gate of the gating transistor 56' of the second address generation network 28 is logically exclusive to the activating signal $\phi_1$ and is maintained at low level at this point of time.

With the transition of the activating signal $\phi_1$ to high level state, the gating transistor 56 is activated to turn on so that the programming signal $V_{PP}$ is applied to the drain of the field-effect transistor forming each of the memory cells 30 to 40 through the transistor 56. Electrons are therefore injected into the floating gate of each of the second, fourth and sixth memory cells 32, 26 and 40 with voltages of high levels appearing at the gate and drain of the transistor of each of these memory cells as well known in the art. The signal $\phi_1$ is maintained at high level until sufficient quantities of electrons have been injected into the floating gates of the memory cells 32, 36 and 40, whereupon the signal $\phi_1$ swings back to the low level as at time $t_{14}$ shown in FIG. 3.

Essentially similar events take place for the programming of the address of the second word line 24. For the second word line 24, it is herein assumed that the lower three bits of the desired address are in the forms of (0, 0, 1). Accordingly, logic "0" bits are supplied as the address bits $x_0$, $x_1$ and $x_2$ the control gates of the transistors of the first, third and sixth memory cells 30', 34' and 40', while logic "1" bits are supplied as the address bits $\bar{x}_0$, $\bar{x}_1$ and $x_2$ to the control gates of the second, fourth and fifth memory cells 32', 36' and 38' as at time $t_{21}$ (FIG. 3). The counter 58 then increments one so that the activating signal $\phi_2$ appearing at the gate of the gating transistor 56' of the second address generation network 28 shifts to high level as at time $t_{23}$. Electrons are thus injected into the floating gates of the second, fourth and fifth memory cells 32', 36' and 38' each having an address bit of a logic "1" level at its control gate. The signal $\phi_2$ thereafter swings back to the low level as at time $t_{24}$. When the addresses have thus been programmed for all the desired word lines, the supply of the programming voltage $V_{PP}$ is cut off as at time $t_{25}$ so that the address programming mode of operation comes to an end.

Description will now be made in regard to the manner in which the addresses programmed as hereinbefore described are to be generated to read out information from the memory array 10 (FIG. 1). In this instance it may be noted that each of the transistors forming the second, fourth and sixth memory cells 32, 36 and 40 of the first address generation network 26 and the transistors forming the first, third and fifth memory cells 30', 34' and 38' of the second address generation network 28 has a sufficiently increased threshold voltage as a result of the injection of electrons into the floating gate of the transistor.

Figure 4:
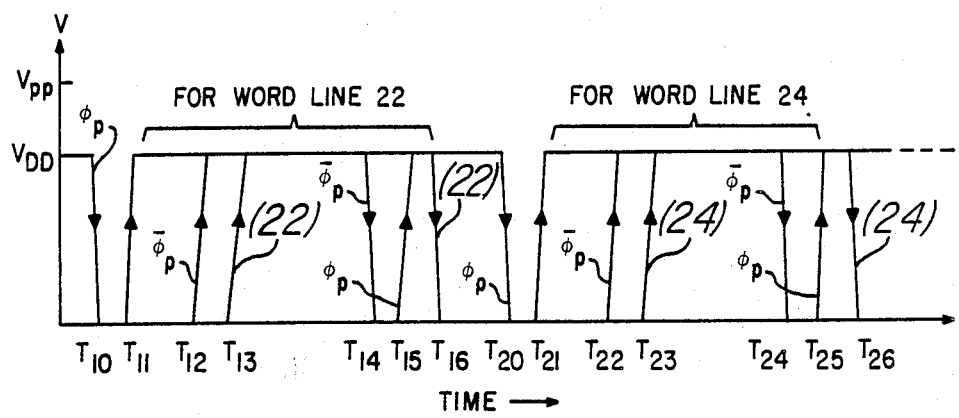
FIG. 4 s a timechart showing the events which are to take place during data read operation in the memory system embodying the invention.

Prior to the start of the reading mode of operation, the address generation network 26 is precharged so that the potential at the common node 42 of the networks is precharged to a level approximating the supply voltage $V_{DD}$. Upon completion of the precharge operation as at time $T_{10}$ shown in FIG. 4, the bits $X_0$, $X_1$ and $X_2$ of an input row address signal are input to the address decoder to produce address bits $x_0$, $x_1$ and $x_2$ of logic "0" level and address bits $\bar{x}_0$, $\bar{x}_1$ and $\bar{x}_2$ of logic "1" level on the common address bus lines 60 of the address decoder as at time $T_{11}$ (FIG. 4). The transistor forming each of the first, third and fifth memory cells 30, 34 and 38 is thus maintained in non-conduction state in response to the address bit of logic "0" level appearing at the control gate of the transistor. The transistor forming each of the second, fourth and sixth memory cells 32, 36 and 40 has an address bit of logic "1" level at the control gate of the memory cell but is also maintained in non-conduction state due to the high threshold value of the transistor. The transistors forming all the memory cells 30 to 40 are thus maintained in non-conduction states so that the potential at the common node 42 of the address generation network 26 is maintained at a level approximating the supply voltage $V_{DD}$. With the potential of a high level thus established at the node 42, the fourth control transistor 48 is turned on but is still disconnected from ground line with the fifth control transistor 50 maintained in non-conduction state at this point of time.

The discharge signal $\phi_P$ then rises to logic "1" level so that the fourth control transistor 50 is activated to turn on as at time $T_{12}$ (FIG. 4). The control transistor 50 being thus turned on, the output node 54 between the second and third control transistors 46 and 48 is connected to ground line through the fourth and fifth control transistors 48 and 50. It therefore follows that the potential at the output node 54 falls to ground level so that a signal of logic "1" level is produced at the output terminal of the buffer inverter 52 and accordingly on the first word line 22 as at time $T_{l3}$ (FIG. 4).

In the second address generation network 28, the transistors forming the first, third and fifth memory cells 30', 34' and 38' are maintained in non-conduction state in response to the logic "0" address bits $x_0$, $x_1$ and $x_2$, respectively while the transistors forming the second and fourth memory cells 32' and 36' are maintained in non-conduction state by reason of the increased threshold levels thereof although the address bits $\bar{x}_0$ and $\bar{x}_1$ of logic "1" level are applied to the control gates of the transistors. However, the transistor forming the sixth memory cell 40' has an initial sufficiently low threshold voltage and is therefore activated to turn on by the address bit $\bar{x}_2$ of logic "1" level so that the potential at the common node 42' is reduced to ground level through the transistor of the memory cell 40. The result is that a signal of logic "0" appears at the output terminal of the buffer inverter 52' and accordingly on the second word line 24.

After information has been read out from the memory cell accessed on the first word line 22 of the memory array 10, the discharge signal $\phi_P$ shifts to low level to cause the fifth control transistor 50 to turn off as at time $T_{14}$ shown in FIG. 4. The precharge signal $\phi_P$ then rises to high level at time $T_{l5}$ for starting the precharge operation for the subsequent read cycle. The common node 42 of the first address generation network 26 is thus for a second time precharged toward the supply voltage $V_{DD}$ so that the signal on the first word line 22 declines as at time $T_{l6}$, whereafter the precharge operation for the subsequent read cycle terminates as at time $T_{20}$.

The second word line 24 is selected by the address bits $x_0$, $x_1$ and $\bar{x}_2$ of logic "0" level and address bits $\bar{x}_0$, $\bar{x}_1$ and $x_2$ of logic "1" level supplied to the common address bus lines 60. In response to these address bits, events similar to those which have occurred at times $T_{12}$ to $T_{16}$ in the first address generation network 22 thus take place as at times $T_{22}$ to $T_{26}$, respectively, in the second address generation network 28. All the desired word lines are in this fashion accessed in the memory array 10 by the programmed sequences of logic "1" and "0" bits generated in the address decoder 12 in response to the bits $X_0$, $X_1$ and $X_2$ of the row address signals supplied from the external source.

In the system shown in FIG. 1, the second row address decoder 14 is generally similar in construction and arrangement to one of the address generation networks such as the first address generation network 26 of the first row address decoder 26 and is for this reason not illustrated in the drawings. The second row address decoder 14 is however responsive to the higher two bits $X_3$ and $X_4$ of a supplied row address signals and therefore has only four memory cells in lieu of the six memory cells of the described address generation network in addition to transistors and counter respectively similar to the transistors and counter of the address generation network. Thus, the second row address decoder 14 is operative to produce an output signal of logic "1" level when, and only when, a single predetermined sequence of logic "1" and "0" address bits is supplied to the four memory cells, each of which is also composed of an EEPROM using an n-channel field-effect transistor.

During each read cycle of operation of the system, a logic "1" signal thus appears at one of the output terminals of the first row address decoder 12 with a logic "0" signal appearing at each of the remaining output terminals of the address decoder 12. The logic "1" output signal from the address decoder 14 is fed to the row address select detection circuit 18 which also receives a single logic "1" signal as well as a plurality of logic "0" signals output from the first row address decoder 12 during each read cycle of operation of the system. The address select detection circuit 18 is typically comprised of a simple logic and is operative to produce a logic "1" output signal (or a logic output signal if preferred) in the copresence of the logic "1" output signal from the second row address decoder 14 and the single logic "1" signal included in the output signals from the first row address decoder 12.

These output signals including a single logic "1" signal are supplied on one hand to the memory array 10 and the other hand to a row address select detection circuit 18. This address select detection circuit 18 also receives the logic "1" or "0" output signal from the second row address decoder 14 and produces an output signal of a logic "1" level in the copresence of the logic "1" output signal from the second row address decoder 14 and a logic "1" signal among the output signals from the first row address decoder 12. In response to the signal of logic "1" level output from the address select detection circuit 18, the clock generator circuit 20 produces the output enable signal $\phi_{OE}$ of a logic "1" level at its first output terminal to enable the output buffer 22 to deliver output signals $O_0$ to $O_{n-1}$ at its output terminals.

In the presence of the signal of logic "1" level at the output terminal of the address select detection circuit 18, the clock generator circuit 20 further produces the output disable signal $\phi_{CS}$ of a logic "1" level at its second output terminal. As previously noted, this output disable signal $\phi_{CS}$ is used for disabling a device on another semiconductor chip provided in association with the memory array 10, as will be described in more detail.

Figure 5:
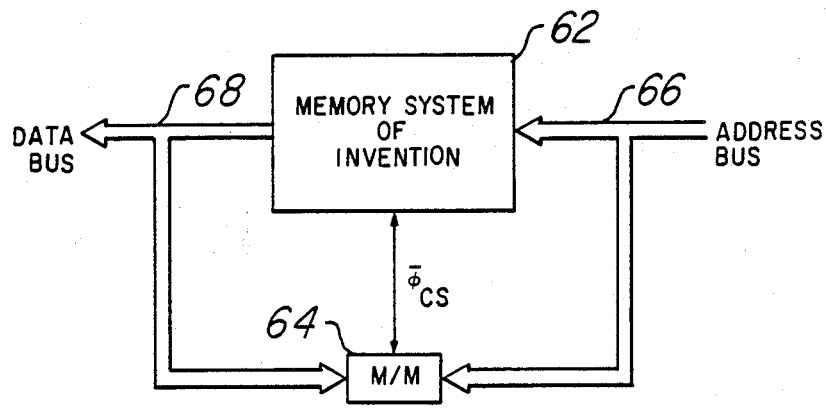
FIG. 5 is a block diagram schematically showing the wired-OR logic arrangement of a memory system according to the present invention as used in combination with a main memory system using a mask ROM device.

FIG. 5 shows the arrangement in which the memory system embodying the present invention, herein represented in its entirety by reference numeral 62, is used as a submemory system in combination with a main memory system 64 (labeled as M/M) using a mask ROM device. With the output disable signal $\phi_{CS}$ applied to an output enable terminal of the main memory system 64 from the submemory system 62, the data outputs of the two memory systems 62 and 64 can be coupled together to form a wired OR logic so that the memory systems partake of a common data bus and also of a common address bus as shown. Thus, the main memory system 64 is enabled for readout operation when the row address transferred to the memory array 10 (FIG. 1) of the submemory system 62 consists of a non-programmed sequence of logic "1" and "0" bits. When the row address fed to the memory array 10 consists of a programmed sequence of logic "1" and "0" bits, then the main memory system 64 is disabled and in turn the submemory system 62 is enabled. This means that the information written into the mask ROM device of the main memory system 62 is in effect revised during read cycles when the programmed addresses are valid and information is read from the memory array 10 of the submemory system 62 in lieu of the main memory system 64.

It will be understood from the above description that, in a memory system according to the present invention, the information which has been written into the mask ROM device of a main memory system can be revised by appropriately programming the addresses for the memory array of the system of the invention. Such two memory systems may be implemented on a single semiconductor chip or may be incorporated in a single package for providing a hybrid configuration of the systems to alleviate or even eliminate the drawbacks inherent in the mask ROM device of the main memory system. It will further be understood that a memory system according to the present invention is useful for relieving the row-related failures of a mask ROM device which could not be remedied by the presently known redundancy techniques typically using a Hamming error check and correction code.

Meanwhile, it is known in the art that, for ROM devices tailored to the storage of Japanese letters and characters, the address space available for the memory device typically consists of $2^{14} = 16384$ bits but only one third of such an address space, viz., about 6800 bits are utilized in reality. A Japanese-character storage ROM device presently in use therefore provides data which can be accessed by 6800 address but can not provide more data. With the use of a memory system according to the present invention, any unused portion of the address space can be arbitrarily utilized by programming the addresses in such a portion so that, for example, any personally defined symbols can be represented by the newly programmed addresses.

It has been assumed that each of the programmable memory array 10 and row address decoders 12 and 14 is made up of non-volatile memory cells such as EEPROM devices but such memory elements may be substituted by static random-access memories (RAMs) if desired.

While, in addition, it has been described that the address bits generated in the first row address decoder 12 are totally programmable and the address bits generated in the second row address decoder 14 are substantially fixed, the described embodiment of a memory system according to the present invention may be modified so that all the address bits to be generated in response to the individual bits of a row address signal are programmable exclusively for each of the supplied row address signals. If desired, the described embodiment of a memory system according to the present invention may be otherwise modified so that not only the row addresses for the word lines but also the column addresses of the bit lines of the memory array are programmable either partly or in toto, exclusively for each of the supplied row and column address signals.

What is claimed is:

1. A memory system comprising:
   a memory array addressed by a first portion of an address signal;
   a first address decoder for generating an output address for said memory array in correspondence to said first portion of said address signal, the first address decoder being programmable and including switches having programmable threshold values, whereby said first address decoder produces a predetermined memory address in response to predetermined addresses represented by said first portion of said address signal;
   means for selectively changing the threshold value of said switches to program said first address decoder;
   a second address decoder for generating an output in correspondence to a second portion of the address signal; and
   an address select detection circuit responsive to the outputs of said first and second address decoders for enabling and disabling an associated active device based on the outputs of said first and second address decoders.

2. The memory system of claim 1 wherein said associated active device is a mask ROM device addressed by said first portion of said address signal.

3. The memory system of claim 1, further comprising a signal generator responsive to an output signal from said address select detection circuit for enabling said memory array to provide an output of data in the presence of the output signal from said address select detection circuit and to disable another active device in the absence of the output signal from the address select detection circuit.

4. The memory system of claim 3 further comprising a column decoder for receiving an output from said memory array, and an output buffer to which an enable signal from said signal generator is applied to enable and deliver an output signal from said memory array.

5. The memory system of claim 1 where the second address decoder is programmable and comprises a plurality of address generation networks, each including:
   (a) switches having a changeable threshold value,
   (b) and means to selectively change the threshold value of said switches whereby said second address decoder produces a predetermined output in response to predetermined addresses of said second portion of said address signal.

6. The memory system of claim 5 wherein said switches are EEPROM devices.

7. The memory system of claim 1 wherein said associated active device is a non-volatile memory cell addressed by said first portion of said address signal.

8. The memory system of claim 7 wherein said non-volatile memory cell comprises an EEPROM device.

9. The memory system of claim 7 wherein said non-volatile memory cell comprises an SRAM device.

10. A memory system having a plurality of memory cells and operable to designate memory cells for access in accordance with a multi-bit address signal, wherein said multi-bit address signal is defined by first and second address signal portions of different bits, said memory system comprising:
    a memory array having a plurality of memory cells arranged in rows and columns and a plurality of access lines arranged in rows and columns and corresponding to the respective rows and columns of said plurality of memory cells of said memory array;
    a first address decoder connected to said memory array;
    means for inputting said first address signal portion of said multi-bit address signal to said first address decoder independently of said second address signal portion;
    said first address decoder generating an output address corresponding to the first address signal portion of the multi-bit address signal to selectively address memory cells of said memory array, said first address decoder being programmable and including switches having programmable threshold values, whereby said first address decoder produces a predetermined memory address in response to predefined addresses represented by said first address signal portion of the multi-bit address signal;
    a second address decoder;
    means for inputting said second address signal portion of said multi-bit address signal to said second address decoder independently of said first address signal portion;
    said second address decoder being responsive to said second address signal portion of said multi-bit address signal for generating an output in correspondence thereto and in sequence with but independent of the output address generated by said first address decoder in response to said first address signal portion of said multi-bit address signal; and
    address select detection means operably interposed between said first and second address decoders and responsive to the outputs of said first and second address decoders for enabling and disabling an associated active device based on the outputs of said first and second address decoders.

11. A memory system as set forth in claim 10, further comprising a signal generator operably connected to said address select detection means and responsive to an output signal therefrom for enabling said memory array to provide a data output in the presence of the output signal from said address select detection means and to disable another active device in the absence of the output signal from said address select detection means.

12. A memory system as set forth in claim 11, wherein said first and second address decoders are row address decoders, and further including a column address decoder connected to said memory array;
    means for inputting a column address signal to said column address decoder in conjunction with said first and second address signal portions respectively input to said first and second address decoders;
    said column address decoder generating an output column address corresponding to said column address signal to selectively address memory cells of said memory array; and an output buffer connected to said column address decoder and to said signal generator for receiving an enable signal from said signal generator to enable and deliver an output data signal from said memory array to said output buffer via said column address decoder.

* * * * *